United States Patent
Fiege

[11] 4,051,549
[45] Sept. 27, 1977

[54] RETAINING BAR FOR CIRCUIT CARD FILE

[76] Inventor: L. Gail Fiege, 4210 Darnall Road, Baltimore, Md. 21236

[21] Appl. No.: 742,571

[22] Filed: Nov. 17, 1976

[51] Int. Cl.² .................................................. H02B 1/02
[52] U.S. Cl. ..................................... 361/399; 361/415; 211/41; 312/9
[58] Field of Search ................ 361/415, 413, 399; 211/40, 41; 206/560

[56] References Cited

U.S. PATENT DOCUMENTS 3,001,102  9/1961  Stiefel .................................. 361/415

FOREIGN PATENT DOCUMENTS 1,100,671  1/1968  United Kingdom ............... 361/415

OTHER PUBLICATIONS

Johnson, L. L., "Card Retention Scheme," IBM Tech. Discl. Bull. vol. 14, No. 9, Feb. 1972, p. 2671.

*Primary Examiner*—David Smith, Jr.
*Attorney, Agent, or Firm*—Sixbey, Bradford & Leedom

[57] ABSTRACT

A hinged retaining bar which engages the otherwise free edges of circuit cards when in position in a card file has an engagement face provided with slots filled with a resilient material. The resilient material provides elastic engagement with the edge of each card whereas the slot edges provide rigid restraint against lateral motion to prevent vibrational damage to the card and abrasive wear of the resilient material. A unique gripping action is attained through a particular slot geometry.

5 Claims, 5 Drawing Figures

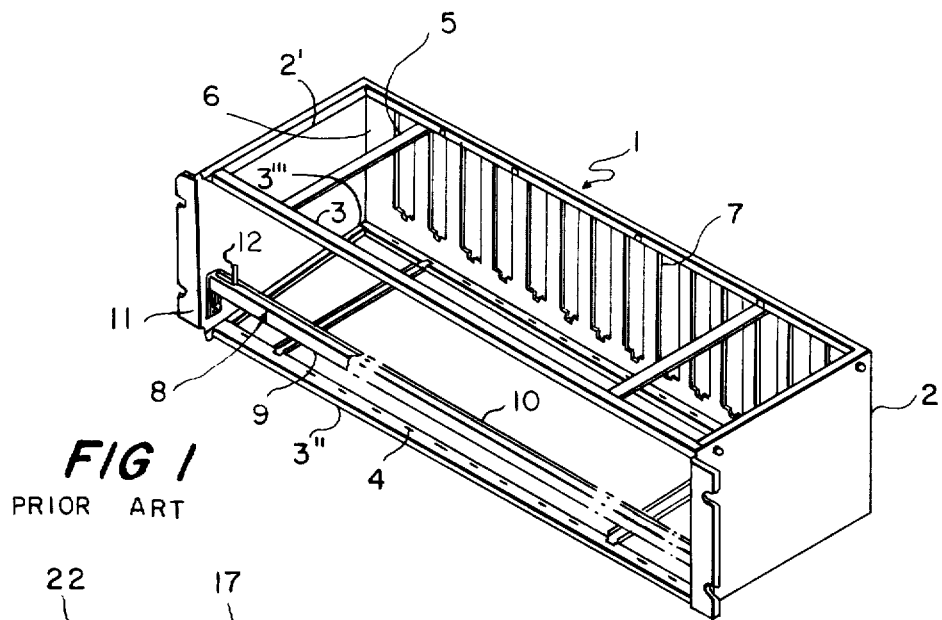
FIG 1
PRIOR ART
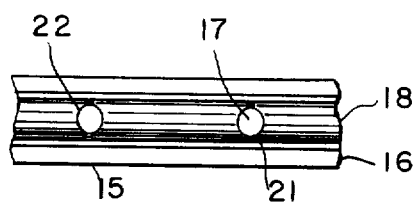
FIG 2
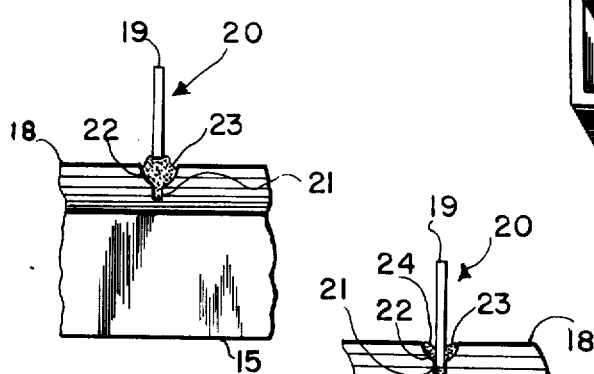
FIG 4
FIG 5
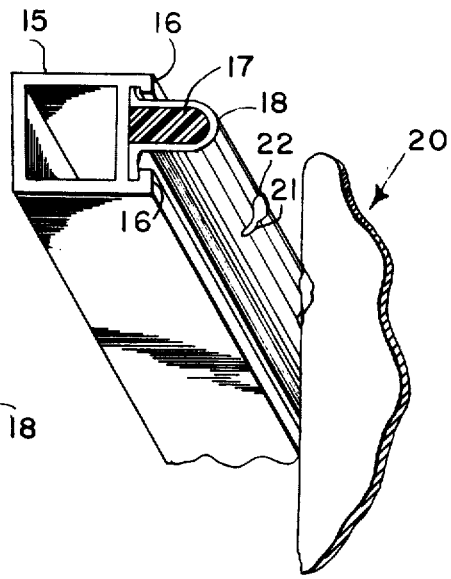
FIG 3

RETAINING BAR FOR CIRCUIT CARD FILE

BACKGROUND OF INVENTION

Circuit card files of a type exemplified by my prior U.S. Pat. No. 3,258,650 issued June 28, 1966 have found widespread use in recent years, the use extending to electronic equipment employed in a number of diverse environments, some of which are quite adverse. A most common adversity is that of shock and vibration, which is experienced in vehicular installations, military ordinance installations, and equipment which includes moving comonents. The effects of shock and vibration are manifested in several detrimental effects. For instance, the cards themselves are constructed of dielectric materials which are somewhat brittle and subject to the development of cracks if permitted to vibrate. Cracks are intolerable, as they can extend across circuit patterns and cause interruption of the conductive pth and consequent malfunction, to say nothing of structural weaking. Another instance is the tendency of a vibrating card to work loose from its electrical connection or to develope high resistance at the contacts.

In order to alleviate problems of shock and vibration, circuit card files of the prior art have been structured to include a hinged retaining bar across the front or open face of the file. The retaining bar may be swung on its hinge axis to a position where it is clear of the front face to permit removal and insertion of cards. After the cards are in place, the bar is swung into position where a resilient engagement face bears against the exposed edges of the cards to retain them in place. While the retaining bar of the prior art is effective to prevent the cards from working loose from their electrical connector, it falls short of providing adequate restriction of vibration in a direction normal to the plane of the card, for the resilient nature of the engagement face imparts sufficient flexibility to permit vibration. Hence, the development of resistence at the connectors and damage to the card itself is not adequately alleviated. Moreover, a serious problem is incurred by virtue of the abrasive effects of the vibrating card edge on the resilient material of the retaining bar engagement face itself, which is abraded away to a point of ineffectiveness in a surprisingly short period of use.

OBJECTS OF INVENTION

It is a general object of this invention to provide a hinged retaining bar for a circuit card file which alleviates the aforementioned problems of the prior art. More specifically, it is among the objects of this invention to provide a retaining bar wherein:
1. the resilient engagement face is not subject to abrasive wear,
2. the card is provided with lateral restraint, and
3. a particular slot geometry provides unique side gripping action adjacent to the card edge.

DESCRIPTION OF DRAWINGS

These, and other self-evident advantages of this invention may be better understood by a consideration of the ensuing specification and accompanying drawings, in which:

FIG. 1 is a perspective view of a circuit card file of the prior art,

FIG. 2 is a plan view of a fragment of the retention face of a retaining bar of this invention, FIG. 3 is a sectional view in perspective showing the engagement face in contact with a circuit card, FIG. 4 is a plan view of a fragment of the retaining bar in initial engagement with a card, and FIG. 5 is a view identical to FIG. 4 showing the relationship of the bar and circuit card in final position.

DESCRIPTION OF INVENTION

For an understanding of the prior art, reference is invited to FIG. 1, which depicts a circuit card file generally indicated at 1 comprising a cage like structure including end plates 2,2' at interconnected by extrusions forming corner rails 3,3', 3", 3'". Each corner rail is provided with longitudinally spaced slots 4 which provide anchorage for circuit card guides 5,5' in a manner set forth in my aforementioned U.S. Pat. No. 3,258,650. In a usual installation, numerous guides would be provided which have been omitted from the drawing for purposes of clarity. The circuit card file includes a rear cover including a cut-out portion 7 in alignment with each card guide anchorage slot 4, the cut-out portions 7 constituting provision for card connector elements (not shown). The card file further includes a hinged retaining bar assembly generally referred to at 8, this assembly including a retaining bar 9 including an engagement face 10 facing the interior of the card file. The bar is carried by end members 11 rigidly connected thereto and pivotally connected to the respective end plates 2,2'. A latch 12 is provided to latch the bar into position wherein the engagement face 10 is in firm engagement with the edge of the circuit cards. The thickness of the resilient engagement face is chosen so as to provide a nominal compression of the face when the bar is in latched position.

The retaining bar of this invention includes an engagement face which differs from the continuous resilient face of the prior art, the difference being best seen by reference to FIG. 3. A retaining bar 15 includes a channel defined by inturned flanges 16,16' in which is received a composite engagement face comprising an elongated resilient element 17 disposed within a slotted channel element 18 of generally U-shape having is convex surface confronting the edge 19 of a circuit card, a fragment of which is indicated generally at 20. The choice of material for the resilient element is at the option of the designer, but should be of sufficient firmness to provide the requisite edge pressure on the card while undergoing enough compression to permit the hinged retaining bar to be latched in its operative position hen the circuit cards are properly positioned at their full insertion depth, i.e., with the electrical connector fully engaged. A preferred material is specified to be neoprene soft with a durometer rating of 35 + 10, further identified under Mil. Standard 67B as SCE-3 or Mil. Standard 11-R-6130B as Grade B Soft.

The channel element 18 includes a plurality of slots 21 positioned in alignment with respective circuit card positions as dictated by the position of card guide anchorage slots 4 of the card file structure. In the preferred embodiment shown in the drawings, each slot 21 includes an enlarged central portion 22 through which a portion of the resilient element 17 extrudes to provide a slight bulbous protrusion 23. This protrusion 23 provides a unique gripping action upon the sides of a card immediately adjacent its edge 19, which action is best understood by reference to FIGS. 4 and 5. FIG. 4 is a representation of a portion of the retainer bar during initial engagement with a circuit card, whereat the protrusion 23 (shown somewhat exagerated for illustrative purposes) comes in contact with the edge 19 of the card 20. As the retaining bar is urged further toward its fully engaged position illustrated in FIG. 5, the edge 19 intrudes into the resilient element 17, forcing the card edge contacting portion of the protrusion inwardly and bringing the remaining portions of the protrusion to bear on the sides of the card as seen at 24. In its final seated position the card edge 19 and adjacent sides are retained in a resilient pocket which in turn is rigidly embraced by the slotted channel element 18. By this structure, vibrational movement is effectively resisted, and a tendency toward abrasive destruction of the resilient engagement face is avoided due to the absence of any relative motion in shear between the corners of the card edge and the retaining bar.

It should be recognized that the basic advantage of this invention can be realized without the presence of the protrusion 23, as in a structure including a slot absent the enlarged central portion 22. In such a structure, the retention pressure against the edge of the card is by the resilient member 17, whereas the confinement in directions normal to the plane of the card is provided by the slot edges 21, and hence is a rigid confinement. In this instance, tolerances between slot width and card thickness would be more restrictive than in the aforedescribed preferred embodiment. Moeover, other resilient elements could be employed, such as metallic springs, etc., where extrusion into the slot is not essential.

It will be readily apparent to those skilled in the art that many modifications of the specific embodiment disclosed herein may be made without departing from the spirit of the present invention, the scope of which is defined in the following claims.

I claim:

1. A circuit card retaining bar assembly for a circuit card file, said retaining bar assembly including an elongated bar hingedly mounted upon said file for movement to a latched retaining position extending across the open side of the card file and having a retention face opposed to the edges of circuit cards contained in said file, said retention face comprising a composite structure including:
    A. a resilient element for engagement with the edges of said cards,
    B. a rigid element including means embracing portions of the sides of said circuit card immediately adjacent to the resiliently engaged edges thereof to define limits of movement of said card in directions normal to the plane thereof when said retaining bar is in said latched retaining position.

2. A circuit card retaining bar assembly as set forth in claim 1 wherein said rigid element is an elongated element which includes a face convex in cross-section and opposed to said card edges and wherein said embracing means comprises the edges of transverse slots in said convex face.

3. A circuit card retaining bar assembly as set forth in claim 2 wherein at least a portion of said slot edges are spaced from said card sides, and a portion of said resilient element is interpositioned between said slot edges and said adjacent portions of the sides of said card.

4. A circuit card retaining bar assembly as set forth in claim 3 wherein said portion of said slot edges are bulged outwardly from the centerline of said slot to provide an enlarged portion of said slot, and wherein said resilient element extrudes through said enlarged portion to form a protrusion registerable with said card edge.

5. A circuit card retaining bar assembly as set forth in claim 4 wherein said resilient element is a soft neoprene of a durometer of substantially the range of 35–45 and wherein at said latched retaining position said interpositioned portions exert a restraining force against said adjacent portions of the sides of said card to supplement the action of said rigid embracement means in defining limits of movement of said card in directions normal to the plane of said card.

* * * * *